United States Patent
Liu et al.

(10) Patent No.: US 10,523,134 B2
(45) Date of Patent: Dec. 31, 2019

(54) COMB DRIVE WITH NON-PARALLEL OVERLAPPING COMB FINGERS

(71) Applicant: MEMS DRIVE, INC., Arcadia, CA (US)

(72) Inventors: Xiaolei Liu, South Pasadena, CA (US); Guiqin Wang, Arcadia, CA (US); Roman Gutierrez, Arcadia, CA (US)

(73) Assignee: MEMS Drive, Inc., Arcadia, CA (US)

( * ) Notice: Subject to any disclaimer, the term of this patent is extended or adjusted under 35 U.S.C. 154(b) by 514 days.

(21) Appl. No.: 14/656,618

(22) Filed: Mar. 12, 2015

(65) Prior Publication Data
US 2016/0268927 A1   Sep. 15, 2016

(51) Int. Cl.
*H02N 1/00* (2006.01)
*B81B 3/00* (2006.01)

(52) U.S. Cl.
CPC ........... *H02N 1/008* (2013.01); *B81B 3/0086* (2013.01); *B81B 2201/033* (2013.01); *B81B 2203/019* (2013.01); *B81B 2203/0136* (2013.01)

(58) Field of Classification Search
CPC .............. H02N 1/008; B81B 2201/033; B81B 2203/0136; B81B 2203/019
See application file for complete search history.

(56) References Cited

U.S. PATENT DOCUMENTS

| | | | | |
|---|---|---|---|---|
| 6,384,510 B1 * | 5/2002 | Grade | ..................... | G02B 6/357 310/309 |
| 8,049,394 B2 * | 11/2011 | Kouma | .................. | H02N 1/008 310/309 |
| 2003/0080648 A1 * | 5/2003 | Jerman | .................. | H02N 1/008 310/309 |
| 2003/0123124 A1 * | 7/2003 | Abu-Ageel | ............ | H02N 1/008 359/290 |
| 2011/0050251 A1 * | 3/2011 | Franke | .................. | B81B 3/0094 324/658 |

(Continued)

FOREIGN PATENT DOCUMENTS

| KR | 20070007511 A | * | 1/2007 |
|---|---|---|---|
| WO | 2002019509 A2 | | 3/2002 |

OTHER PUBLICATIONS

Jensen et al., Shaped Comb Fingers for Tailored Electromechanical Restoring Force, Jun. 6, 2003, Journal of Microelectromechanical Sys., vol. 12, No. 3.*

(Continued)

*Primary Examiner* — Quyen P Leung
*Assistant Examiner* — Eric Johnson
(74) *Attorney, Agent, or Firm* — Brian J. Colandreo; Michael T. Abramson; Holland & Knight LLP

(57) ABSTRACT

A comb drive includes an inactive comb finger array and an opposing active comb finger array positioned to oppose the inactive comb finger array and configured to move in a non-linear path relative to the inactive comb finger array, wherein each comb finger array includes a comb spine and a plurality of comb fingers extending from its comb spine, and each comb finger on the active comb finger array is shaped to match a non-parallel profile. The non-parallel profile may be tapered, curved, or selected to linearize the capacitance in a gap between adjacent comb fingers from the inactive comb finger array when a comb finger from the active comb finger array moves through the gap.

11 Claims, 10 Drawing Sheets

(56) References Cited

U.S. PATENT DOCUMENTS

2015/0160455 A1\* 6/2015 Artman .............. G02B 26/0816
                                                      359/221.2
2015/0270826 A1\* 9/2015 Burak .................... H03H 9/547
                                                      333/187

OTHER PUBLICATIONS

Moon, Machine Translation of KR20070007511, Jan. 2007.\*

\* cited by examiner

COMB DRIVE WITH NON-PARALLEL OVERLAPPING COMB FINGERS

FIELD OF THE INVENTION

The present disclosure relates generally to electro-mechanical devices and systems, such as microelectromechanical systems (MEMS). More particularly, various embodiments of the technology disclosed herein are directed towards comb drive actuator devices and methods of fabrication.

BACKGROUND

Actuators may be used to convert electronic signals into mechanical motion. In many applications, such as, for example, portable electronic devices, miniature cameras, optical telecommunications components, and medical instruments, it may be beneficial for miniature actuators to fit within the specific size, power, reliability, and cost constraints of the application.

MEMS is a miniaturization technology that uses processes such as photolithography and etching of silicon wafers to form highly precise mechanical structures with electronic functionality. MEMS actuators generally function in a similar fashion to conventional actuators but offer some beneficial features over conventional actuators, and are formed using MEMS processes.

In some applications, such as moving an image sensor in a camera for automatic focusing (AF) or optical image stabilization (OIS), an actuator is used to move an optoelectronic device that has a number of electrical inputs and outputs. For example, European patent No. EP 0253375, entitled "Two-dimensional piezoelectric actuator," by Fukada et al., teaches a design for a two-dimensional actuator that can be used to move an image sensor in a plane. The actuator taught by Fukada, however, is large and unamenable to space-constrained applications. For example, Fukuda's actuator may be used in large, stand-alone digital cameras, but not in miniature cell phone cameras, due to the associated space constraints.

Unlike conventional piezoelectric actuators, MEMS actuators may be used to, for example, move or position certain passive components within miniature cell phone cameras. By way of example, U.S. Pat. No. 8,604,663, entitled "Motion controlled actuator," by Roman Gutierrez et al., and U.S. Patent Application No. 2013/0077945 A1, entitled "Mems-based optical image stabilization," by Xiao-lei Liu et al., teach MEMS actuators for moving a lens in a miniature camera (e.g., for use in a cell phone). However, neither of these MEMS actuators is able to move an optoelectronic device that has a number of electrical inputs and outputs. In addition, both of these MEMS actuators utilize deployment mechanisms that add complexity, size, and cost.

BRIEF SUMMARY OF EMBODIMENTS

The present disclosure is directed towards MEMS actuators, and more specifically, towards comb drive actuators. As disclosed herein, a comb drive actuator may include a first comb finger array and a second comb finger array, wherein each of the first comb finger array the second comb finger array include a comb spine and a plurality of comb fingers extending in a first or second direction from that comb spine. For example, the first comb array may be an inactive, or non-moving comb array that anchors in position to a larger sub-structure, and the second comb finger array may be an active, or moving comb finger array that couples to an actuator stage to move a desired component relative to the sub-structure. The comb fingers of the inactive comb finger array, then, might extend in a first direction from the inactive comb finger array's spine, and the comb fingers of the active comb finger array might extend in a second direction from the active comb finger array's spine, wherein the first direction opposes the second direction. When the comb fingers of either the inactive comb finger array or the active comb finger array are electrified (i.e., a voltage or a charge is applied to them), the comb drive may change from an inactive configuration to an active configuration, and the active comb array will move in response to a motive force generated in response to an electric field generated between adjacent comb fingers, and in a direction opposite of the electric field gradient.

Each comb finger on either or both comb finger arrays may have a non-parallel shape. For example, the shape may be tapered such that a distal end of the comb finger is narrower than a proximal end of the comb finger. The shape may also be curved, to enable opposing comb finger arrays to interleave when the comb finger arrays move in an arcuate path relative to each other. The shape may also be a non-uniform non-parallel profile. For example, in some embodiments, the non-parallel profile may be a non-linear profile that is calculated as a solution to capacitance linearization equation, such that the capacitance in a gap formed by adjacent comb fingers of the first comb finger array is linear when a comb finger from the second comb finger array moves through the gap. In some embodiments, a comb finger array may include comb fingers with different shapes (e.g., one or more comb fingers may be tapered, one or more comb fingers may be curved, and/or one or more comb fingers may have non-linear profiles).

In some embodiments, comb fingers on each comb finger array extend from the respective comb spine in a direction that forms a non-orthogonal angle with the comb spine. For example, the comb fingers on the first comb finger array may form a first non-orthogonal angle with the first comb spine, and the comb fingers on the second comb finger array may form a second non-orthogonal angle with the second comb spine, wherein the first non-orthogonal angle may approximately equal, but mirror, the second non-orthogonal angle. Angling the comb fingers relative to the comb spines may further facilitate non-linear (e.g., arcuate) motion.

Some embodiments disclosed herein provide a method of fabricating a comb drive with tapered comb fingers that initially overlap and that do not require the use of a comb drive deployment device to separate opposing comb finger arrays prior to operation. For example, a method for fabricating a comb drive may include forming on a substrate (e.g., a silicon wafer), with a first lithography process, a first comb structure that includes a first set of comb fingers extending in a first direction from a first comb spine, and forming on the same substrate, with the first lithography process, a second comb structure that includes a second set of comb fingers extending in a second direction from a second comb spine, wherein the first direction opposes the second direction. Each comb finger may be tapered such that a proximal comb finger end is wider than a distal comb finger end, and the first set of comb fingers may partially interleave with the second set of comb fingers.

Some examples of the method may also include defining with lithography and, then, pattern etching each of the first comb structure and the second comb structure. The method may also include depositing a patterned insulation layer and a patterned conductive layer to each of the first comb structure and the second comb structure. The shape of the patterns may also defined by lithography. The method may also include release etching to remove unwanted material and release the devices.

Some embodiments of the method may also include freeing a comb drive from the substrate, coupling the first comb structure to a sub-structure component, and the second comb structure to an actuator stage component, and activating the comb drive by electrifying (i.e., applying a voltage or a charge to the comb fingers), without first separating the comb fingers from their interleaved position using a comb drive deployment mechanism.

Other features and aspects of the disclosure will become apparent from the following detailed description, taken in conjunction with the accompanying drawings, which illustrate, by way of example, the features in accordance with embodiments of the disclosure. The summary is not intended to limit the scope of the invention, which is defined solely by the claims attached hereto.

BRIEF DESCRIPTION OF THE DRAWINGS

The present disclosure, in accordance with one or more various embodiments, is described in detail with reference to the following figures. The drawings are provided for purposes of illustration only and merely depict typical or example embodiments of the disclosure. These drawings are provided to facilitate the reader's understanding of the disclosure and shall not be considered limiting of the breadth, scope, or applicability of the disclosure.

Figure 1:
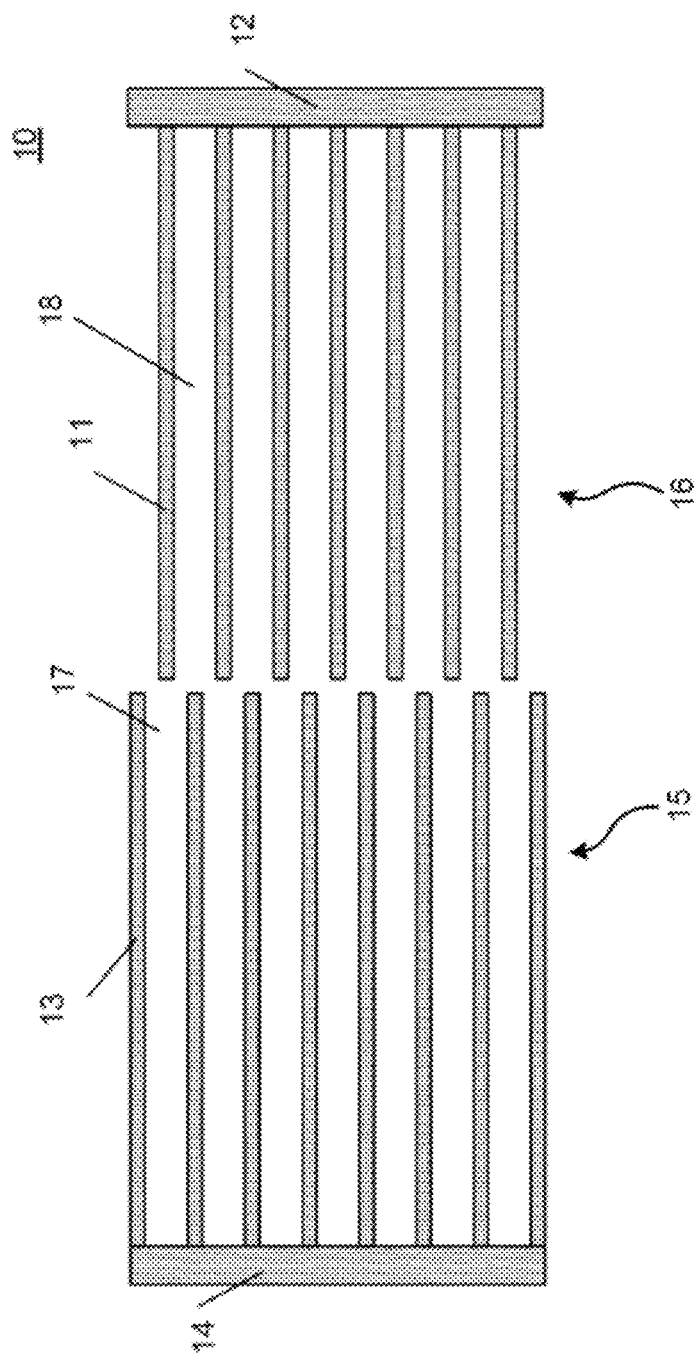
FIG. 1 is a top down illustration of a conventional comb drive with standard comb fingers.

These figures are not intended to be exhaustive or to limit the invention to the precise form disclosed. It should be understood that the embodiments of the disclosure can be practiced with modification and alteration, and can be limited only by the claims and the equivalents thereof.

DETAILED DESCRIPTION OF THE EMBODIMENTS

One form of MEMS actuator is a comb drive actuator. The comb drive actuator includes one or more pairs of opposing comb finger arrays. Each comb finger array comprises a comb spine and a plurality of comb fingers, shaped to resemble a comb with each comb finger extending from the comb spine. For examples, each comb finger may extend orthogonally from the comb spine, or may extend at a non-orthogonal angle from the comb spine. Each comb finger array opposes a partner comb finger array such that the comb fingers may interleave with each other. The comb finger arrays may then be electrified to generate a motive force relative to the electric fields created between comb fingers. The motive force is generated in an axis parallel to the comb fingers. Accordingly, if a first comb finger array is held in a fixed position, its partner comb finger array may be coupled to an actuator stage such that, when the comb fingers are electrified, the partner comb finger array and attached actuator stage move relative to the first comb finger array.

Comb drive actuators with rectangular shaped comb fingers are not conducive to non-linear in-plane movement between the fixed comb finger array and moving comb finger array, because the shape of the combs may create a physical barrier to such non-parallel movement. Another problem with rectangular shaped combed fingers is that, as the combs move closer together, the force may increase to a point that causes a "lock in" condition where the comb drive actuator no longer operates, or motion may become jerky and unresponsive to normal controls. Moreover, the nonlinearity of capacitance as a function of displacement of opposing comb fingers may introduce local, large differential capacitance. This local, large differential capacitance may diminish resolution and/or precision control of the comb drive actuator, and may also induce a bi-stable or multiple stable state that leads to hysteresis and/or instability. Similarly, as the comb fingers move further apart, the motive force may reduce to the point that the mass of the actuator stage and load become prohibitive to movement. Thus, a comb drive actuator designed for non-linear (e.g., arcuate) motion would benefit from linearization of the capacitance along the entire movement of the comb fingers.

Another problem with conventional comb drives is that they require a comb drive deployment step during fabrication to separate opposing comb array pairs. For example, fabrication is more efficient if opposing comb finger arrays are designed and fabricated in an overlapping, or interleaved position. The combs must also be fabricated with a sufficiently small gap between comb fingers as to generate sufficient capacitance to generate the motive force required to move the actuator stage and load. But, if the comb drive is activated with the comb fingers in the initial overlapping position, and the sufficiently small gap between comb fingers, the comb drive may suffer from the lock in condition described above. Conventional fabrication techniques used to solve this problem require the use of a comb drive deployment mechanism to separate opposing comb array pairs as a final fabrication step before the comb drive may be activated. This step increases fabrication costs and time.

The present disclosure is directed towards a comb finger actuator device with non-parallel shaped comb fingers. In some embodiments, the comb fingers are tapered, curved, or shaped with non-linear profiles calculated to linearize capacitance between corresponding comb finger gaps during arcuate motion. In some embodiments, the comb fingers may form non-orthogonal angles relative to corresponding comb spines. Embodiments disclosed herein are also directed towards methods for fabricating comb drives with non-parallel shaped comb fingers in an initially interleaved configuration without the need for a comb drive deployment step to separate opposing comb finger arrays prior to activating the comb drive.

FIG. 1 is a top down illustration of a conventional comb drive with standard comb fingers. The comb-drive 10 includes opposing supporting comb spines 12 and 14 and opposing comb finger arrays 15 and 16. For example, comb finger array 15 may comprise a plurality of comb fingers 13, wherein each comb finger 13 has a nearly rectangular shape such that the width of each comb finger at a comb finger distal end is approximately the same as the width of each comb finger at a proximal comb finger end. For example, the proximal comb finger end is the end of the comb finger that couples to the comb spine, and the distal comb finger end is the end of the comb finger opposite of the comb spine. In addition, each comb finger 13 protrudes orthogonally from comb spine 14. Comb fingers 13 are spaced at nearly equal intervals along comb spine 14, leaving a uniform gap 17 between each comb finger, such that the width of gap 17 between adjacent comb fingers at each distal comb finger end is approximately the same as the width of gap 17 at each proximal comb finger end.

Similarly, comb finger array 16 may comprise a plurality of comb fingers 11, wherein each comb finger 11 also has a nearly rectangular shape and protrudes orthogonally from comb spine 12 in a parallel, but opposite direction as comb fingers 13 protruding from comb spine 14. Comb fingers 11 are also spaced at nearly equal intervals along comb spine 12, leaving a uniform gap 18 between each comb finger, such that the width of gap 18 between adjacent comb fingers at each distal comb finger end is approximately the same as the width of gap 18 at each proximal comb finger end.

During operation, comb fingers 13 and/or 11 may be electrified (e.g., a voltage or a charge may be applied) to create an electric field between adjacent comb fingers, that may be converted into motive force in a direction parallel to the comb fingers. In response to electrification of comb fingers 11 and/or 13, comb arrays 15 and 16 may either be attracted together. Accordingly, if one of comb finger arrays 15 and 16 is held in an inactive position, then the other of comb finger arrays 15 and 16 may be moveable and coupled to an actuator stage, such that electrification of the comb fingers may cause the actuator stage to move.

Gap 17 must be sufficiently wide to accept an opposing comb finger 11, but sufficiently narrow such that the electric field created when the comb fingers are electrified is sufficient to create a strong enough motive force to move the actuator stage. Some manufacturing processes, may include forming the comb drive with opposing comb finger arrays positioned in an overlapping position (e.g., comb fingers 13 are interleaved with comb fingers 11). However, if the comb fingers are rectangular shaped, and comb finger arrays 15 and/or 16 are electrified in the initial full overlapping position, the motive force generated may overwhelm the comb drive and lock up the opposing comb finger arrays, rendering the comb drive unusable. Thus, in a configuration with overlapping rectangular shaped comb fingers, a comb drive deployment mechanism must be used to pull the comb finger sets apart from their initial positions. After the comb finger arrays are formed, the comb finger arrays can be deployed by separating them prior to electrification.

In addition, comb drives with rectangular shaped fingers may experience problems with arcuate motion. Arcuate motion may include arc-like, angular, or rotary motion of the active comb finger array relative to the inactive comb finger array. To maintain controlled motion of the actuator stage, flexure components may be used to confine stage motion relative to a desired axis for a given set of comb finger arrays. In some examples, comb fingers that are positioned orthogonally to the comb spine may impede arcuate motion by physically limiting any arcuate motion deviating from motion directly parallel to the comb fingers themselves. Alternatively, if the comb fingers are positioned with sufficient gap space to enable the arcuate motion, the arcuate motion may create non-linear electric fields throughout the motion such that the motive force will be non-linear.

Embodiments of this disclosure are designed to vary the shape and positioning of the opposing comb finger arrays to overcome the limitations described above.

Figure 2A:
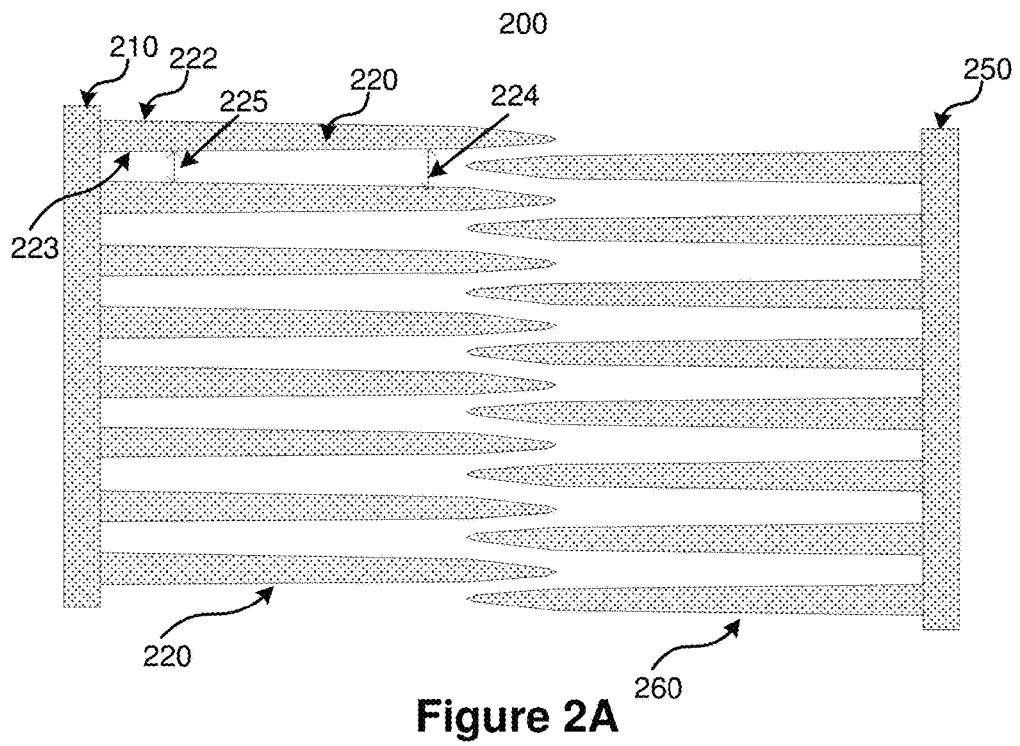
FIG. 2A is a top down illustration of a comb drive with tapered comb fingers, consistent with embodiments disclosed herein.

FIG. 2A is a top down illustration of a comb drive with tapered comb fingers. Referring to FIG. 2A, comb drive 200 may comprise opposing comb spines 210 and 250 and opposing comb finger arrays 220 and 260. A first comb finger array may include a plurality of tapered comb fingers 220. Each tapered comb finger 220 includes opposing outside edges 222 and 223. The tapered comb fingers 220 are tapered such that the width of the tapered comb finger at the proximal comb finger end (i.e., the distance between outside edge 222 and opposing outside edge 223) is larger than the width of the tapered comb finger at the distal comb finger end. Accordingly, a proximal gap end 225 (the gap being defined by the outside edge 222 of a first comb finger and the outside edge 223 of a second, adjacent comb finger) is smaller than a distal gap end 224, such that each tapered comb finger 220 is further from its adjacent comb fingers at the distal comb finger ends than at the proximal comb finger ends.

Accordingly, capacitance per unit comb finger length between adjacent tapered comb fingers may be smaller at the distal comb finger end than at the proximal comb finger end. Thus, the first array of tapered comb fingers may be fabricated in an overlapping position with the second array of tapered comb fingers, such that tapered comb fingers 220 interleave with opposing tapered comb fingers 260.

There is no need to separate, or deploy the opposing comb finger arrays because, given the lower capacitance per unit comb finger length and motive force at the initially overlapping distal comb finger ends is weaker than at the proximal comb finger ends, the opposing comb finger arrays will not lock up when they are electrified. However, because the proximal gap end 225 is narrower, capacitance and motive force are greater between adjacent tapered comb fingers at the proximal comb finger ends, such that sufficient motive force is generated to cause the actuator stage to move when the comb finger arrays are electrified.

Figure 2B:
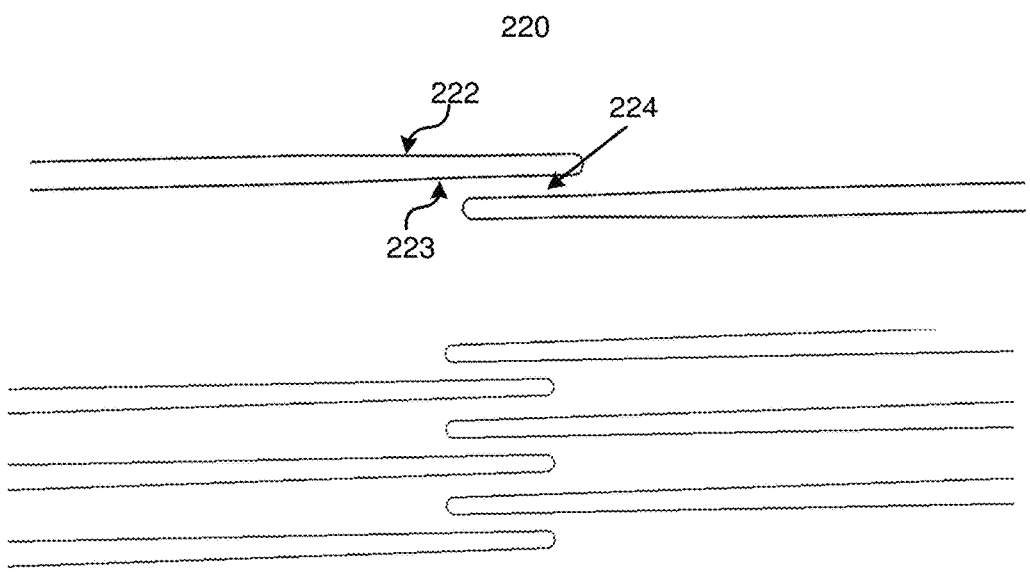
FIG. 2B is a top down illustration of tapered comb fingers, consistent with embodiments disclosed herein.
Figure 2C:
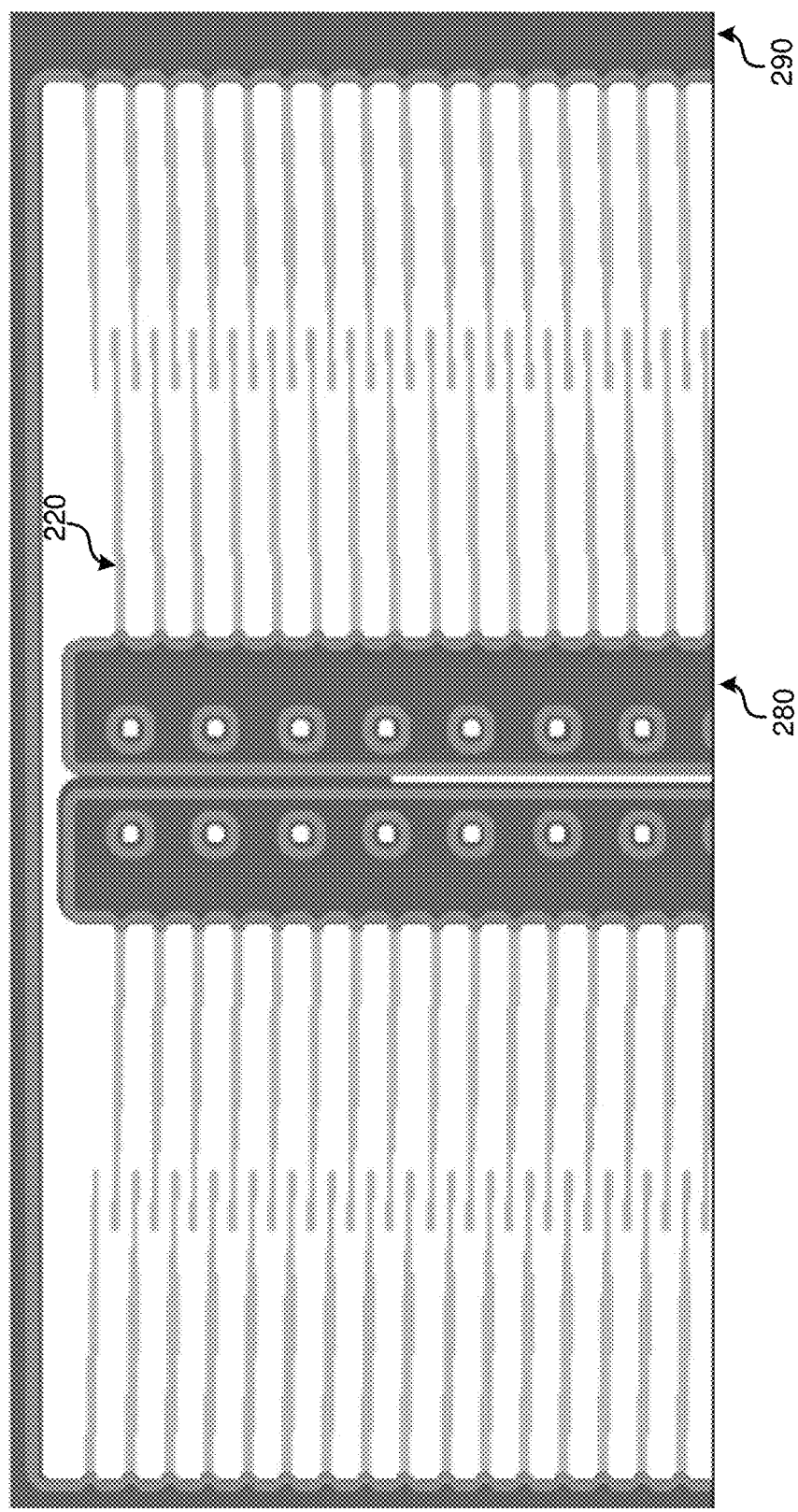
FIG. 2C is a top down illustration of a comb drive with tapered comb fingers, consistent with embodiments disclosed herein.

FIG. 2B is a top down illustration of tapered comb fingers. As illustrated, tapered comb fingers are narrower at the distal comb finger end than they are at the proximal comb finger end. FIG. 2C is a top down illustration of a comb drive with tapered comb fingers. As illustrated, opposing comb finger arrays may be configured in an initially overlapping, or interleaved position. A first comb finger array 280 may be coupled to a moving actuator stage, and a second and third comb finger arrays 290 and 292 may be anchored in an inactive, non-moving position. The configuration illustrated may enable bidirectional motion for the actuator stage by activating the second comb finger array, 290, to move in a first direction, and activating the third comb finger array, 292, to move in a second direction.

Figure 3A:
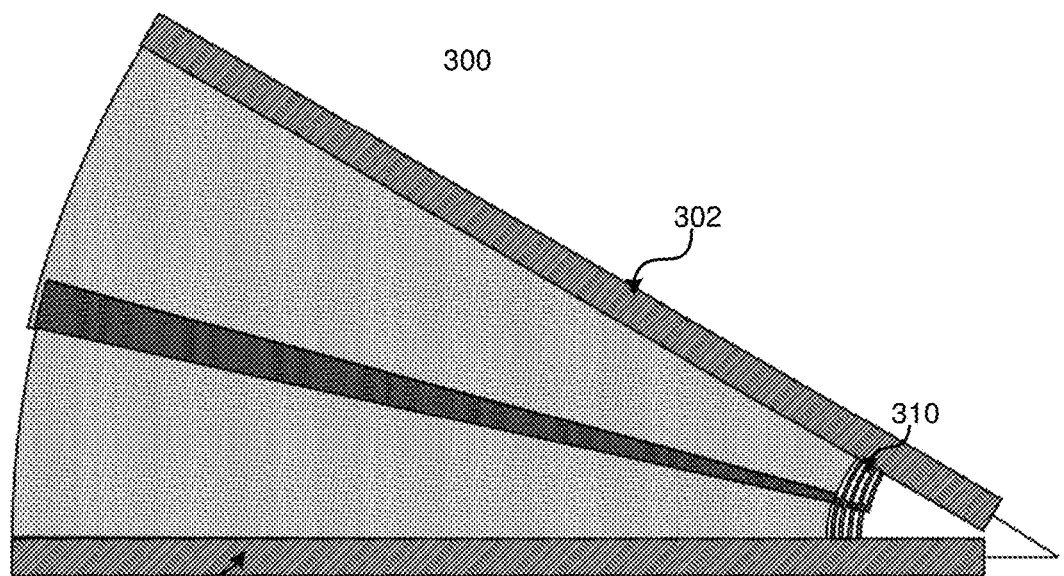
FIG. 3A is a top down illustration of an arcuate comb drive with curved comb fingers, consistent with embodiments disclosed herein.

FIG. 3A is a top down illustration of a rotary comb drive with curved comb fingers. Referring to FIG. 3A, actuator stage 302 may be configured to move in a rotary, or angular path relative to anchor 304. Accordingly, comb drive 310 may be configured to enable rotary motion.

Figure 3B:
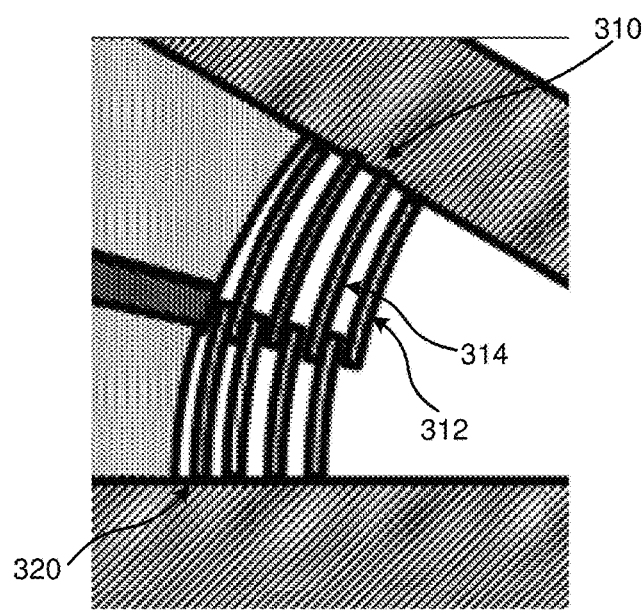
FIG. 3B is a top down illustration of an arcuate comb drive with curved comb fingers, consistent with embodiments disclosed herein.

FIG. 3B is a top down magnified view of comb drive 310. As illustrated, comb fingers 312 may be curved to accommodate the arcuate motion. In such a configuration, capacitance between adjacent comb fingers may be non-linear.

Figure 4:
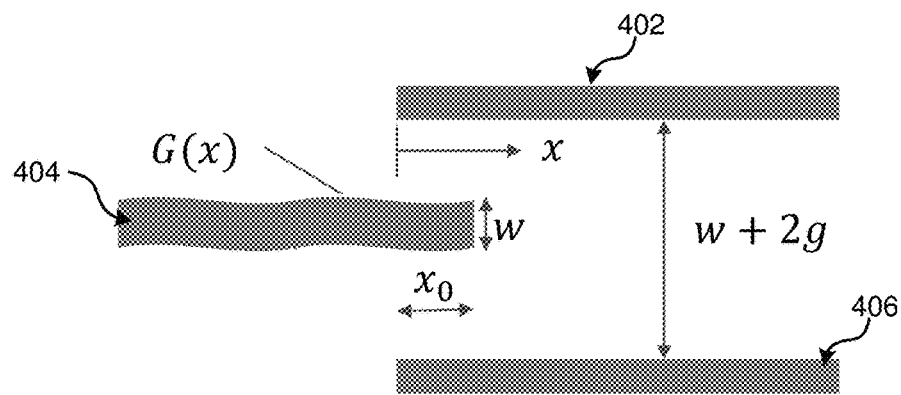
FIG. 4 is a top down illustration of a non-linear shaped comb finger, consistent with embodiments disclosed herein.

FIG. 4 is a top down illustration of a non-linear shaped comb finger. The shape of comb finger 404, represented by function G(x), may be designed to linearize the capacitance adjacent comb fingers 402 and 406 when comb finger 404 moves between comb fingers 402 and 406 in direction x. In some embodiments, the shape of comb finger 404, represented by G(x), may be designed to maintain linear changes in capacitance, in correlation with arcuate movement of comb finger 404 between comb fingers 402 and 406.

In general, capacitance, C, between parallel plates, similar to comb fingers 402 and 406, may be approximated using the Laplace equation, shown as Equation 1 below:

$$C = \varepsilon \frac{s}{g} \quad (1)$$

The gap distance between parallel plates is represented in Equation 1 as g, where $\varepsilon$ represents the permittivity of air, and S represents the area of the gap overlap. However, if the gap is non-uniform, for example, because comb finger 404 begins to move between comb fingers 402 and 404, and possibly in an arcuate motion, then capacitance may be approximated by integrating the capacitance along the non-uniform gap, g(x,y), as shown in Equation 2 below:

$$C = \varepsilon \int\int_S \frac{dx \cdot dy}{g(x, y)} \quad (2)$$

As illustrated in FIG. 4, and for the purposes of these equations, the x-axis is horizontal, the y-axis is in-plane and perpendicular to the x-axis, and the z-axis (not shown) runs perpendicular to the x-axis and the y-axis. In Equation 2, g(x,y) is equal to the distance between adjacent comb fingers, as shown in Equation 3 below:

$$g(x,y) = z_{top}(x,y) - z_{bottom}(x,y) \quad (3)$$

Referring still to FIG. 4, the surface profile of the top surface of moving comb finger 404 is represented by $G(x_0)$. The starting point of comb finger 404, then, would be $G(x)=0$, and the top gap, between comb fingers 404 and 402, may be approximated according to Equation 4 below:

$$g - G(x) - \Delta(0), x \in [0, X_0] \quad (4)$$

With respect to Equation 4, $\Delta(X)$ represents arcuate motion, which is controlled by motion control flexures, and $X_0$ represents the initial overlap length of opposing comb fingers. Similarly, the bottom gap, between fingers 404 and 406, may be approximated according to Equation 5 below:

$$g + G(x) + \Delta(0), x \in [0, X_0] \quad (5)$$

As comb finger 404 moves in the x direction, it may also move in other degrees of freedom. For example, comb finger 404 may follow an arcuate path. The offset of comb finger 404 as it moves in the x direction, then, can be represented as $y = \Delta(X)$, and the top and bottom gap functions become:

$$g - G(x-X) - \Delta(X), x \in [0, X + X_0] \quad (6)$$

$$g + G(x-X) + \Delta(X), x \in [0, X + X_0] \quad (7)$$

Combining the above equations, a capacitance profile may be represented by a solution to a comb finger capacitance linearization equation, for example, as shown in Equation 8:

$$C = \varepsilon t \int_0^{X+X_0} \left[ \frac{1}{g - G(x-X) - \Delta X} + \frac{1}{g + G(x-X) + \Delta X} \right] dx \quad (8)$$

Equation 8 represents capacitance for a single comb finger with uniform width in the y direction. Total capacitance, then, may be calculated by multiplying C by the total number of comb fingers in the comb finger array. A desired, linear capacitance may then be approximated as:

$$C = C_0 + \lambda \varepsilon t \frac{2X}{g} \quad (9)$$

In Equation 9, initial capacitance $C_0$ is the capacitance at $X=0$, and $\lambda$ is an availability factor, greater than 1, to account for the fact that as the comb fingers move, capacitance increases faster than the minimum achievable capacitance represented by Equations 8. The comb finger shape profile, then, to achieve a linear capacitance can be represented by solving Equation 10:

$$\frac{\lambda}{g^2} = \frac{1}{[g - G(-X) - \Delta(X)][g + G(-X) + \Delta(X)]} + \int_{-X}^{X_0} \frac{2[G(x) + \Delta(X)]}{[g - G(x) - \Delta(X)]^2 [g + G(x) + \Delta(X)]^2} \frac{d\Delta}{dX} dx \quad (10)$$

Equation 10 cannot be solved analytically, but can be approximated numerically or can be solved by discretizing into Equation 11 below:

$$\frac{\lambda}{g^2} = \frac{1}{[g - G_{-n+1} - \Delta_{n+1}][g + G_{-n-1} + \Delta_{n+1}]} + \quad (11)$$

-continued $$\Delta x \Delta'_n \sum_{i=-n}^{n_0} \frac{2[G_i + \Delta_n]}{[g - G_i - \Delta_n]^2 + [g + G_i + \Delta_n]^2}$$

Figure 5:
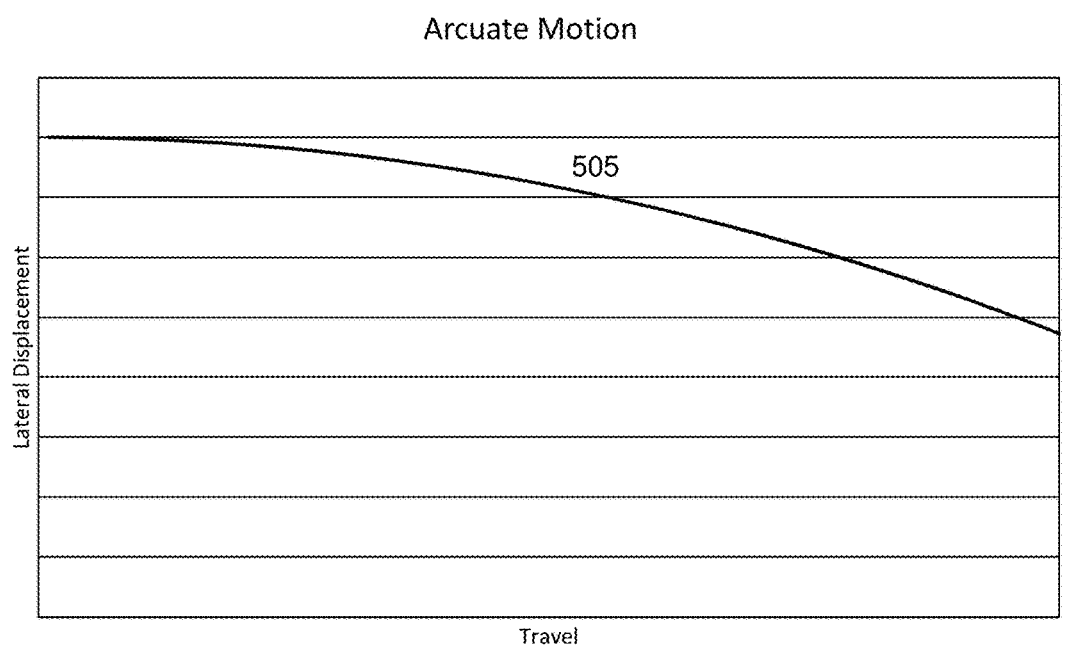
FIG. 5 is a graph illustrating a relationship between lateral displacement along a y-axis direction and travel along an x-axis direction of a comb finger experiencing arcuate motion.

FIG. 5 is a graph illustrating a relationship between lateral displacement along a y-axis direction and travel along an x-axis direction of a comb finger experiencing arcuate motion. The arcuate motion shown in FIG. 5 can be used to approximate inputs to Equation 11 to calculate and linearize capacitance.

Figure 6:
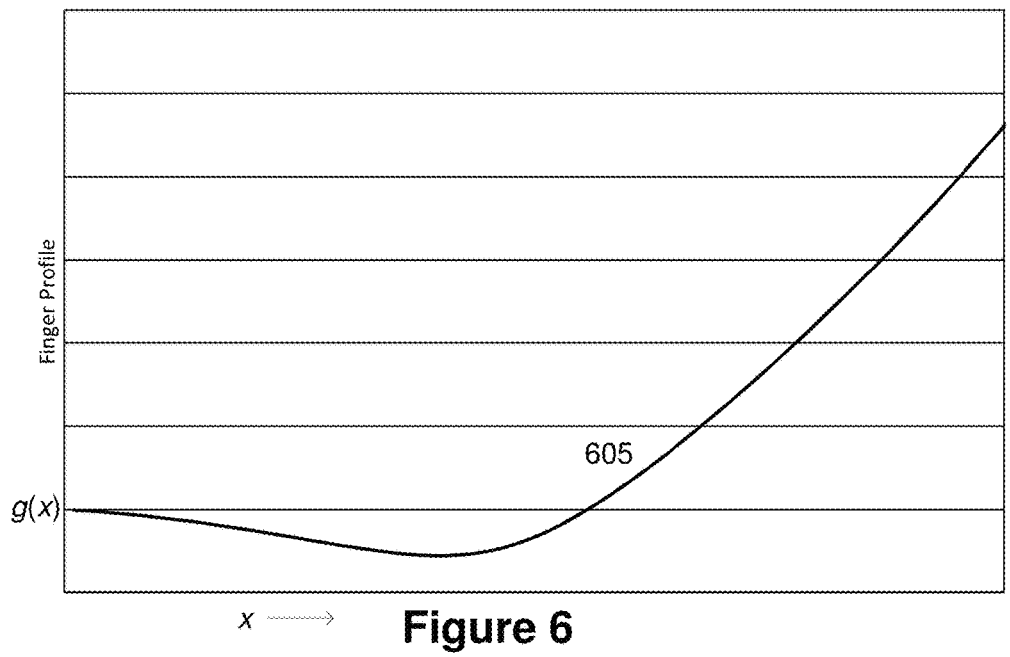
FIG. 6 is a graph illustrating a comb finger profile along y-axis direction and x-axis directions as calculated to achieve a linear capacitance as measured at the comb finger surface when the comb finger experiences arcuate motion.

FIG. 6 is a graph illustrating the comb finger profile along y-axis direction and x-axis directions. When Equation 8 is solved numerically, a comb finger profile, g(x), is calculated. Given one example arcuate motion profile (e.g., the motion profile illustrated in FIG. 5), comb finger profile g(x) may resemble the profile shown in FIG. 6.

Figure 7:
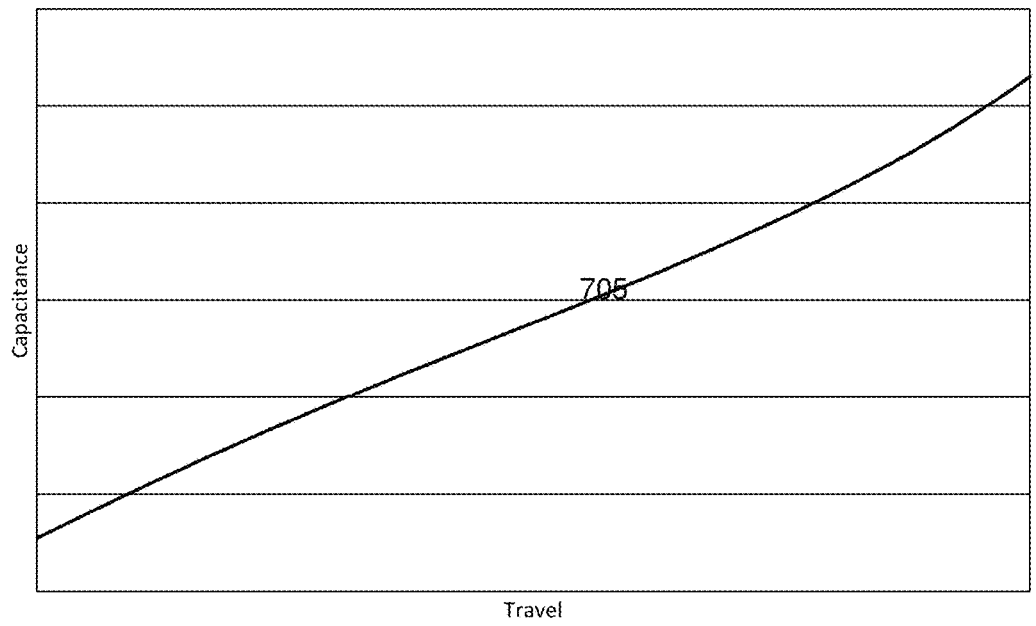
FIG. 7 is a graph illustrating a relationship between travel along an x-axis direction and capacitance at a comb finger surface for a comb finger with the profile illustrated in FIG. 6 experiencing arcuate motion.

FIG. 7 is a graph illustrating a relationship between travel along an x-axis direction and capacitance at a comb finger surface for a comb finger with the profile illustrated in FIG. 6 experiencing arcuate motion. As illustrated by FIG. 7, when g(x) is calculated according to Equation 8 to resemble the comb finger profile shown in FIG. 6, corresponding to the arcuate motion profile illustrated in FIG. 5, then capacitance between adjacent comb fingers may be linearized to resemble the capacitance profile shown in FIG. 7.

Figure 8A:
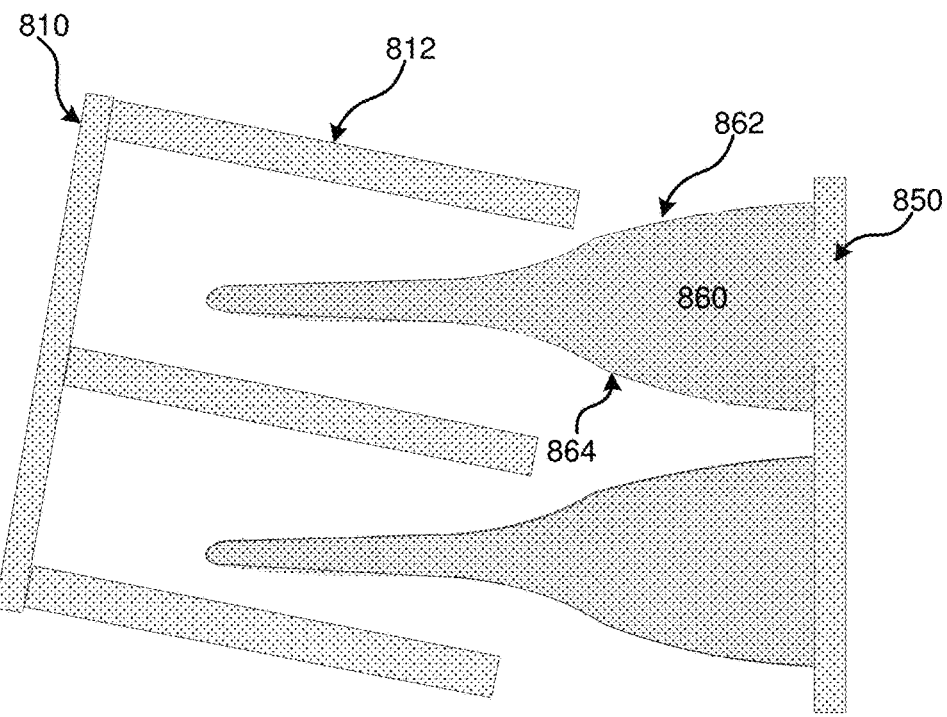
FIG. 8A is a top down illustration of a comb drive with non-linear shaped comb fingers, consistent with embodiments disclosed herein.

FIG. 8A is a top down illustration of a comb drive with non-linear shaped comb fingers. Referring now to FIG. 8A, a non-moving comb finger array may include comb spine 810 and straight comb fingers 812. The opposing comb finger array may include comb spine 850 and non-linear shaped comb fingers 860. Each non-linear comb finger may include a top comb finger edge 862 and a bottom comb finger edge 864.

In some examples, top comb finger edge 862 may be a mirror image of bottom comb finger edge 864, such that the non-linear shape may bulge outward on one end (e.g., the proximal comb finger end) and may narrow on the other comb finger end (e.g., the distal comb finger end). The profile of top comb finger edge 862 may match the comb finger profile illustrated in FIG. 6, or may use another comb finger profile G(x) that approximates a solution to Equation 8 for different actuator motion profiles. The profile of bottom comb finger edge 864, then, may be an inverse of g(x).

In some embodiments, the profile of comb finger edges 862 and 864 may not match, for example, if comb fingers 812 are not exactly parallel, or a varied capacitance profile is desired. Other shapes for comb fingers 860 may be used as would be known by one of skill in the art, in view of the desired capacitance profile as approximated by Equation 8.

Figure 8B:
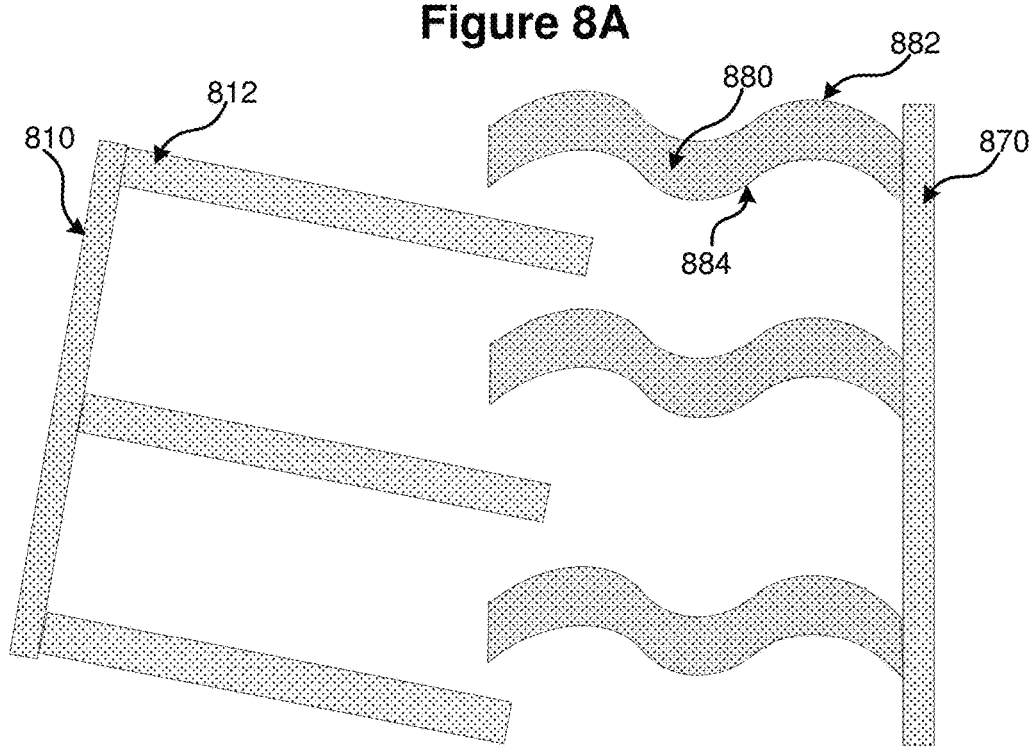
FIG. 8B is a top down illustration of a comb drive with non-linear shaped comb fingers, consistent with embodiments disclosed herein.

FIG. 8B is a top down illustration of a comb drive with non-linear shaped comb fingers. Similar to comb fingers 860 illustrated in FIG. 8A, comb fingers 880 may have a top comb finger edge 882 and a bottom comb finger edge 884. As shown in FIG. 8B, the comb finger profiles for comb finger edges 882 and 884 may each approximate the profile calculated as g(x) in Equation 8, and thus, the comb finger may curve, or resemble a wavy line. Thus, top comb finger edge 882 exactly matches, but is offset from bottom comb finger edge 884.

Both non-linear comb finger arrays illustrated in FIG. 8A and FIG. 8B may be configured to move in an arcuate motion, or other non-linear motion. In some examples, the non-linear comb finger array is stationary and the straight comb finger array is configured to move. In other embodiments, both comb finger arrays may include non-linear combs to achieve desired gap shapes during non-linear motion of one or both comb finger arrays.

Figure 9A:
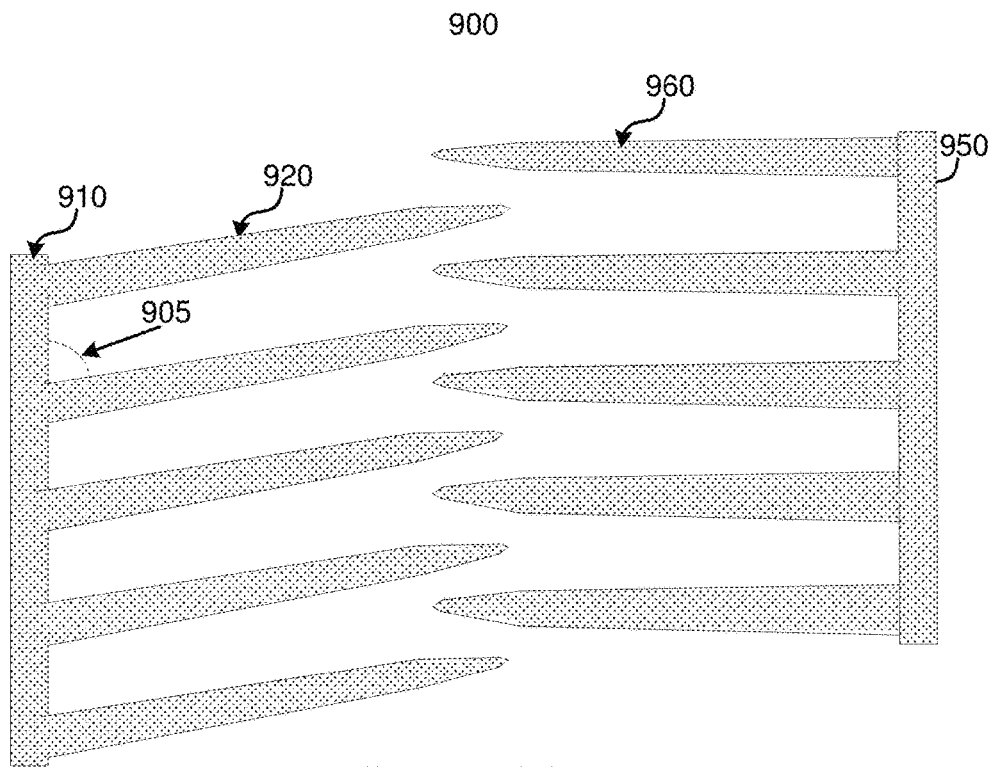
FIG. 9A is a top down illustration of a comb drive with tapered comb fingers configured at a non-orthogonal angle relative to a comb spine, consistent with embodiments disclosed herein.

FIG. 9A is a top down illustration of a comb drive with tapered comb fingers configured at a non-orthogonal angle relative to a comb spine. A first comb finger array may include a first comb spine 910 and a first set of comb fingers 920. A second comb finger array may include a second comb spine 950 and a second set of comb fingers 960. Each of the first set of comb fingers 920 may couple to first comb spine 910 at a non-orthogonal angle 905. The angled comb fingers 920, then, may enable arcuate motion, or other non-parallel and/or non-linear motion with respect to the second comb finger array. In some examples, the second set of comb fingers 960 each couple to the second comb spine 950 at ninety degree (orthogonal), or near-orthogonal angles.

Figure 9B:
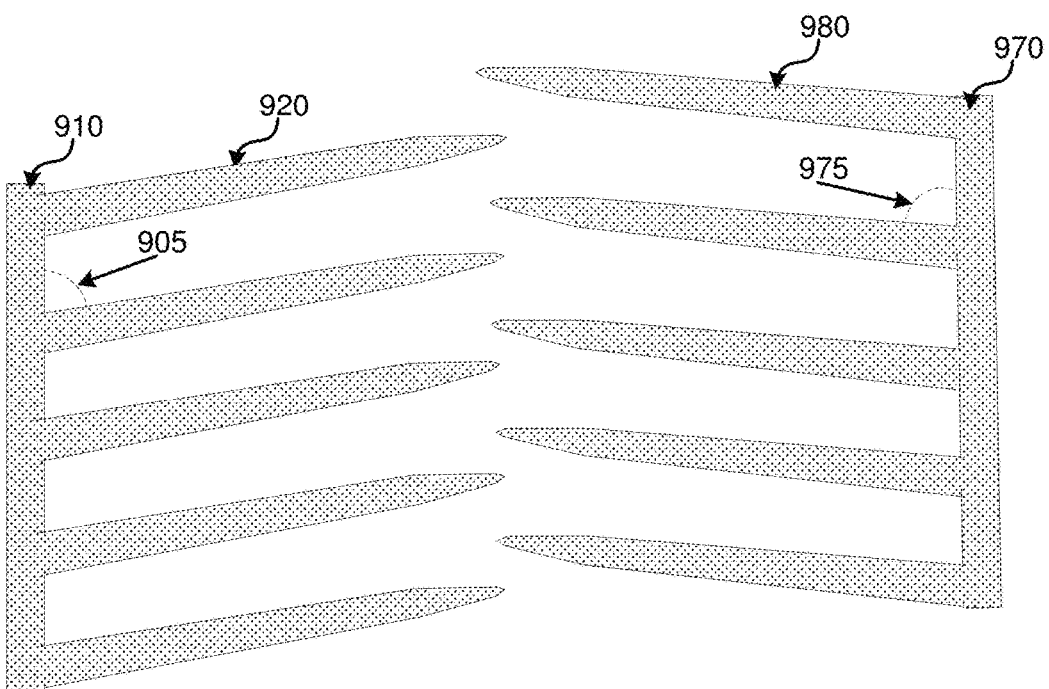
FIG. 9B is a top down illustration of a comb drive with tapered comb fingers configured at a non-orthogonal angle relative to a comb spine, consistent with embodiments disclosed herein.

FIG. 9B is a top down illustration of a comb drive with tapered comb fingers configured at a non-orthogonal angle relative to a comb spine. As illustrated, in some examples, both comb finger arrays may include comb fingers that couple to their respective comb spines at non-orthogonal angles 905 and 975. The comb spines themselves may be rectangular in shape, or non-rectangular in shape. Opposing comb spines may be parallel relative to each other, or may form other angles relative to each other (e.g., similar to the comb spines 810 and 850 illustrated in FIG. 8A).

In some examples, comb fingers 920 and 960 may be straight comb fingers. Alternatively, comb fingers 920 and/or 960 may be tapered comb fingers, similar to the comb fingers illustrated with respect to FIGS. 2A, 2B, and 2C. In other examples, comb fingers 920 and/or 960 may be non-linear shaped comb fingers, following a comb finger profile calculated as g(x) from Equation 11. In other examples, comb fingers 920 and 960 may be curved comb fingers similar to the comb fingers illustrated in FIGS. 3A and 3B, or other non-parallel finger profile as would be known in the art. By angling the comb fingers relative to the comb spine, and incorporating tapered and/or non-parallel comb finger profiles, different variations of movement profiles (e.g., arcuate motion) may be achieved while maintaining near-linear capacitance, or other desired capacitance profiles.

Figure 10:
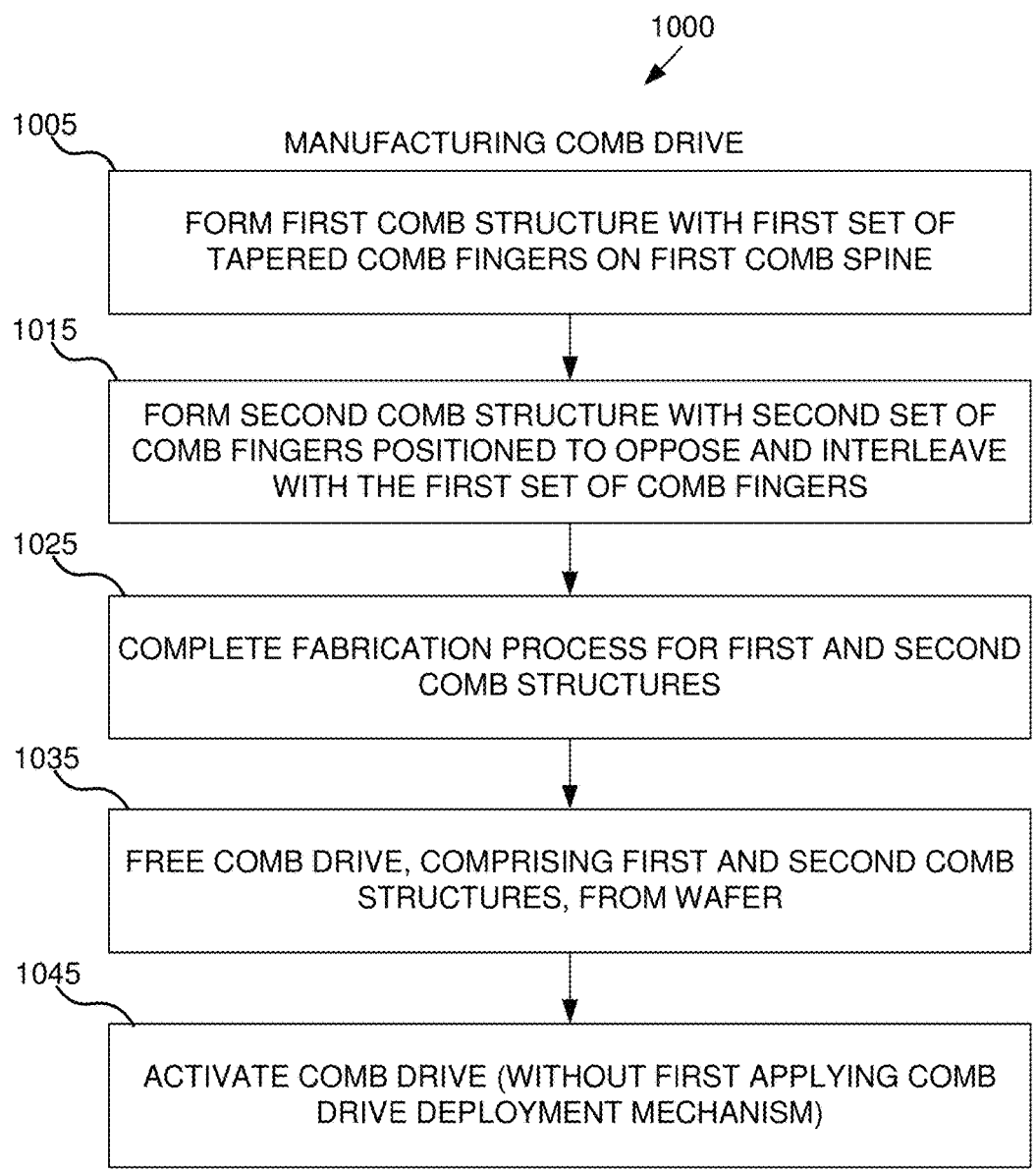
FIG. 10 is a flow chart illustrating a comb drive manufacturing process, consistent with embodiments disclosed herein.

FIG. 10 is a flow chart illustrating a comb drive manufacturing process. This comb drive manufacturing process may be used to fabricate tapered and initially overlapping/interleaved comb fingers, to avoid the requirement of a comb finger separation or deployment step prior to operation. Accordingly, a tapered comb drive manufacturing process may include forming on a substrate (e.g., a silicon wafer) a first comb structure with a first set of tapered comb fingers coupled to a first comb spine at step 1005, and forming a second comb structure with a second set of comb fingers positioned to oppose and overlap the first set of comb fingers at step 1015. The first bomb structure and second comb structure may be formed at the same time, using the same process. For example, the first and second sets of tapered comb fingers may be laid out in a pattern similar to the pattern shown in FIG. 2C. Many other patterns may be achieved, and different comb finger orientations, for example, with non-orthogonal angles relative to the comb spine, may be used.

A process for manufacturing a tapered comb drive may further include completing the fabrication of the first and second comb structures at step 1025 using traditional comb drive fabrication techniques and freeing the first and second comb drive structures from the substrate (e.g., the silicon wafer) at step 1035. The process may then include placing the completed comb drive actuator in place on a MEMS device and electrifying, or activating the comb drive at step 1045. Note that, because of the tapering of the comb fingers, no additional deployment or separation step is required to move the comb fingers apart from each other. Instead, each comb drive may be activated while the comb fingers remain in a partially overlapping or interleaved formation.

Figure 11:
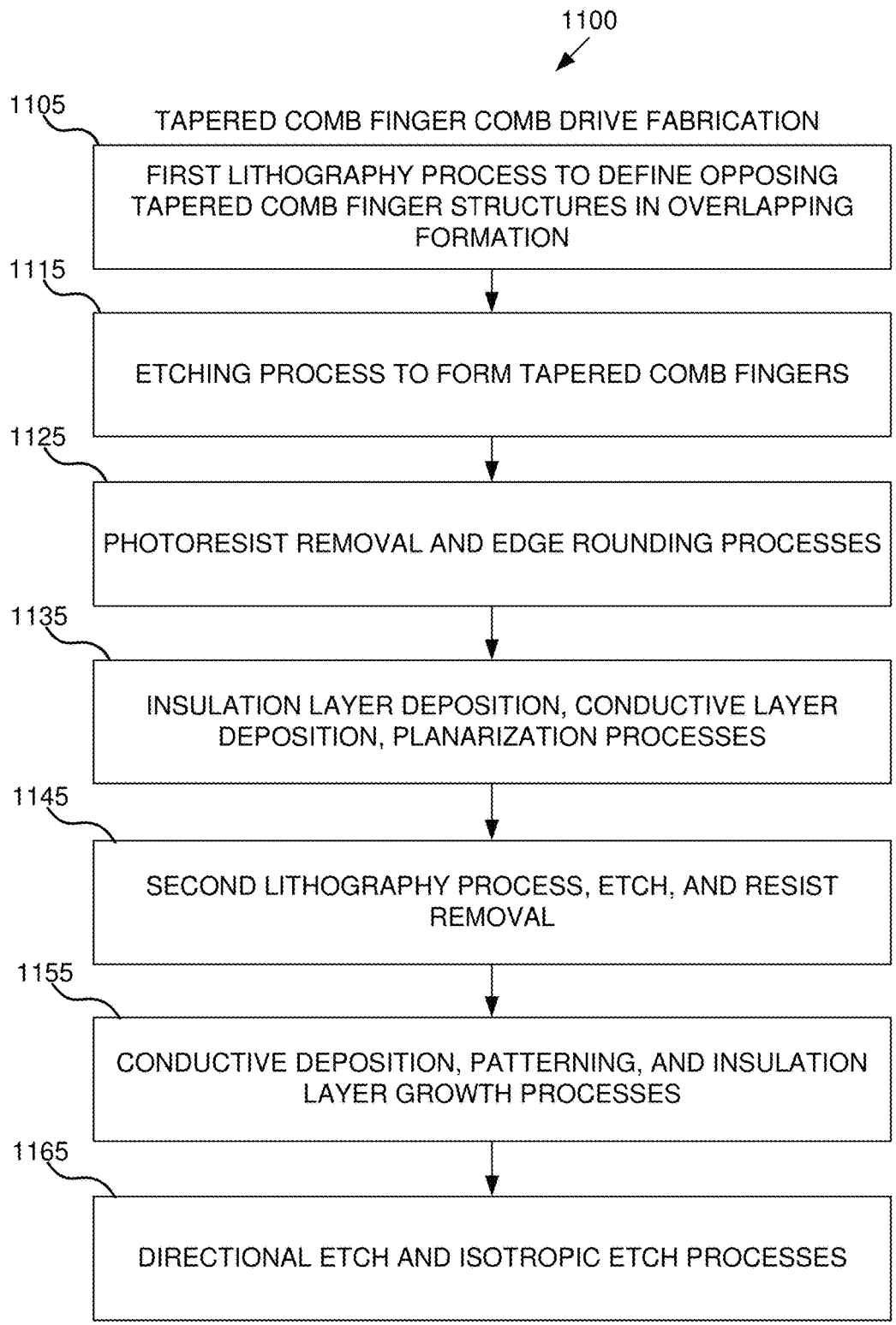
FIG. 11 is a flow chart illustrating a comb drive manufacturing process, consistent with embodiments disclosed herein.

FIG. 11 is a flow chart illustrating a comb drive fabrication process. A comb drive fabrication process may include a first lithography process to define opposing tapered comb finger structures in an overlapping or interleaved formation at step 1105. For example, the lithography process may start from transferring patterns from photo mask to photoresist. The patterns may be transferred to a hard mask layer (e.g., of silicon oxide or silicon nitride), that is grown or deposited on the substrate surface previously, in order to facilitate ultra-long time etching to create a desired high aspect ratio trench. Patterns may be transferred to the photoresist using the mask layer.

The fabrication process may further include etching the tapered comb finger structures at step 1115. For example, a deep reactive ion etching (DRIE) process may be used for etching. These specific examples of fabrication process techniques are for illustrative purposes, and other processes may be used to accomplish similar results, as would be known in the art.

The fabrication process may further include growing and/or depositing an insulation layer, and growing and/or depositing a conductive layer. For example, the insulating layer may be $SiO_2$, $Si_3N_4$, or other Oxides, Nitrides, or known insulating material. The deposition may be accomplished using atomic layer deposition (ALD), chemical vapor deposition, such as low pressure chemical vapor deposition (LPCVD) or plasma enhanced chemical vapor deposition (PECVD), epitaxy, or other known deposition methods. The conductive layer may be doped poly silicon, doped germanium, or other metals or conductive materials as would be known in the art. Deposition may be accomplished using LPCVD, PECVD, epitaxy deposition, ALD, electroplating, sputtering, pulsed laser deposition (PLD), physical vapor deposition (PVD), arc-PVD, e-beam or thermal evaporation, or other deposition methods as known in the art.

The fabrication process may also include applying second lithography and etching processes at step 1145 and depositing and/or growing additional conductive and insulation layers at step 1155. The deposition processes may also include an additional patterning process. The fabrication process may also include a directional and/or isotropic etching process at step 1165 to release the structures from the substrate. The isotropic etching may be RIE, $XeF_2$ etching, chemical etching, or other etching processes as known in the art.

While various embodiments of the present disclosure have been described above, it should be understood that they have been presented by way of example only, and not of limitation. Likewise, the various diagrams may depict an example architectural or other configuration for the disclosure, which is done to aid in understanding the features and functionality that can be included in various embodiments. Such embodiments are not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present disclosure. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although this disclosure describes various example embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments, whether or not such embodiments are described and whether or not such features are presented as being a part of a described embodiment. Thus, the breadth and scope of the present disclosure should not be limited by any of the above-described example embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide example instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of example block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A comb drive, comprising:
a first comb finger array and a second comb finger array;
wherein the first comb finger array comprises a first comb spine and a plurality of first comb fingers, wherein each first comb finger extends in a first direction from the first comb spine, is shaped to match a non-parallel profile, and forms a first gap relative to an adjacent first comb finger that is large enough to accept a corresponding second comb finger;

the second comb finger array comprises a second comb spine and a plurality of second comb finger, wherein each second comb finger extends in a second direction from the second comb spine, and the second direction opposes the first direction; and the first comb finger array is configured to move in a non-linear path relative to the second comb finger array when the first comb fingers are exposed to a motive force generated when the second comb array is electrified, wherein the non-parallel profile is a non-linear profile that is calculated to linearize capacitance between a pair of adjacent second comb fingers, when a corresponding first comb finger aligns with and moves towards the second comb spine through a second gap created between the pair of adjacent second comb fingers in an arcuate path in a translational motion without rotation of the first comb spine, wherein the first direction opposes the second direction and forms, at a first vertical mid-plane of the plurality of first comb fingers, a first non-orthogonal angle relative to where the plurality of first comb fingers connect to the first comb spine, and wherein the second direction forms, at a second vertical mid-plane of the plurality of second comb fingers, a second non-orthogonal angle relative to where the plurality of second comb fingers connect to the second comb spine.

2. The comb drive of claim 1, wherein the non-linear path is the arcuate path, such that the first comb spine moves in an angular direction relative to the second comb spine.

3. The comb drive of claim 2, wherein the non-parallel profile creates a curve that follows the arcuate path.

4. The comb drive of claim 2, wherein the first non-orthogonal angle is the same as the second non-orthogonal angle.

5. The comb drive of claim 1, wherein each first comb finger comprises a top edge and a bottom edge, the non-linear profile comprises a non-linear first profile and a non-linear second profile, the top edge is shaped to match the non-linear first profile, and the bottom edge is shaped to match the non-linear second profile.

6. The comb drive of claim 5, wherein the non-linear first profile is calculated as a solution to a comb finger capacitance linearization equation.

7. The comb drive of claim 6, wherein the non-linear second profile is the same as the non-linear first profile.

8. The comb drive of claim 6, wherein the non-linear second profile is the inverse of the non-linear first profile, such that the bottom edge is shaped as to mirror the top edge.

9. The comb drive of claim 1, wherein each second comb finger is rectangular.

10. The comb drive of claim 1, wherein each second comb finger is tapered.

11. A comb drive comprising:

a first comb structure comprising a first plurality of comb fingers extending in a first directions from a first comb spine;

a second comb structure comprising a second plurality of comb fingers extending in a second direction from a second comb spine;

wherein each comb finger comprises a proximal comb finger end and a distal comb finger end, and is tapered, such that the proximal comb finger end is wider than the distal comb finger end;

the first direction opposes the second direction and forms, at a first vertical mid-plane of the first plurality of comb fingers, a first non-orthogonal angle relative to where the first plurality of comb fingers connect to the first comb spine;

the second direction forms, at a second vertical mid-plane of the second plurality of comb fingers, a second non-orthogonal angle relative to where the second plurality of comb fingers connect to the second comb spine, wherein the second non-orthogonal angle mirrors the first non-orthogonal angle;

the first comb structure partially interleaves with the second comb structure when the comb drive is in an initial configuration; and the first comb structure is configured to move in an arcuate path in a translational motion without rotation of the first comb spine relative to the second comb structure when the first comb fingers are exposed to a motive force generated when the second comb structure is electrified, wherein the first non-orthogonal angle is the same as the second non-orthogonal angle.

* * * * *